United States Patent
Arnold et al.

(10) Patent No.: US 12,063,015 B2
(45) Date of Patent: Aug. 13, 2024

(54) AMPLIFIER WITH POWER COMBINATION AND INTERNAL REDUNDANCY AND MODULAR HOUSING

(71) Applicant: Tesat-Spacecom GmbH & Co. KG, Backnang (DE)

(72) Inventors: Christian Arnold, Backnang (DE); Andreas Wacker, Backnang (DE); Martin Kirsch, Backnang (DE); Joachim Daeubler, Backnang (DE); Felix Maye, Backnang (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 693 days.

(21) Appl. No.: 17/227,585

(22) Filed: Apr. 12, 2021

(65) Prior Publication Data
US 2021/0328556 A1   Oct. 21, 2021

(30) Foreign Application Priority Data

Apr. 20, 2020   (DE) .................... 10 2020 110 652.1

(51) Int. Cl.
*H03F 1/52*   (2006.01)
*H03F 3/19*   (2006.01)
*H03F 3/21*   (2006.01)

(52) U.S. Cl.
CPC ............. *H03F 1/526* (2013.01); *H03F 3/19* (2013.01); *H03F 3/21* (2013.01)

(58) Field of Classification Search
CPC ............. H03F 1/526; H03F 3/19; H03F 3/21
See application file for complete search history.

(56) References Cited

U.S. PATENT DOCUMENTS

| | | | |
|---|---|---|---|
| 4,002,980 A | | 1/1977 | Herz |
| 5,594,939 A | * | 1/1997 | Curello ............... H04B 7/2045 |
| | | | 455/12.1 |
| 5,963,845 A | | 10/1999 | Floury et al. |
| 9,848,370 B1 | * | 12/2017 | Freedman .......... H04B 7/18515 |
| 2011/0149525 A1 | * | 6/2011 | Turner .................. H05K 7/207 |
| | | | 361/730 |
| 2012/0280748 A1 | * | 11/2012 | Tronche .................... H03F 3/24 |
| | | | 330/124 R |

OTHER PUBLICATIONS

French Search Report for Application No. FR2103926 completed Dec. 19, 2022. 2 pgs. (see p. 1, categorizing the cited references).

* cited by examiner

*Primary Examiner* — Patricia T Nguyen
(74) *Attorney, Agent, or Firm* — Lerner David LLP

(57) ABSTRACT

An amplifier arrangement has a plurality of function strings, which are required for nominal operation. In addition, the amplifier arrangement has a redundancy circuit and a redundant function string including a redundant converter and a redundant amplifier. If a function string is faulty, the redundancy circuit supplies the input signals of the faulty function string to the redundant function string. In addition, a high-frequency system with an inner housing and an outer housing is described, wherein an air gap separates the inner housing and the outer housing from one another so that high-frequency signals can be transmitted via the air gap between the inner housing and the outer housing.

9 Claims, 7 Drawing Sheets

AMPLIFIER WITH POWER COMBINATION AND INTERNAL REDUNDANCY AND MODULAR HOUSING

FIELD OF THE INVENTION

The present description relates to an amplifier arrangement, in particular an amplifier arrangement with internal redundancy. The amplifier arrangement described herein is suitable, in particular, for amplifying high-frequency signals.

BACKGROUND OF THE INVENTION

High-frequency-related systems are used, for example, on communication satellites in order to process, for example to amplify, to combine and to filter, communication signals. The high-frequency system often consists of individual modules (for example filters, couplers, isolators, pre-amplifiers, power amplifiers, etc.), which are connected to one another. In order to achieve security against failures of individual assemblies, more electronic assemblies (for example amplifiers) are generally used than are required in nominal operation. In the event of a failure, there is a switchover between the redundant amplifiers, that is to say a redundant amplifier takes over the task of a failed amplifier.

This concept can be applied to all electronic component parts and is not limited to amplifiers. In the most general sense, a redundancy concept can be described so that more component parts of a specific type are kept available than are required in nominal operation. In the event of a fault, one of the redundant component parts is used to replace a failed component part.

Other redundancy concepts are likewise possible: for example, the same task can be performed by component parts of a different type and configuration. The values output by said component parts can be compared with one another in order to then decide which of said values is used as the basis for further processing.

BRIEF SUMMARY OF THE INVENTION

An aspect relates to specifying an electronic signal processing unit with internal or encapsulated redundancy. In the following text, the signal processing unit is described as an amplifier arrangement, wherein it should be noted, however, that the concepts described with reference to the amplifier arrangement can also be applied to other signal processing units.

According to a first aspect, an amplifier arrangement is specified. The amplifier arrangement has a plurality of input connections, a redundancy switching mechanism, a converter unit, an amplifier unit connected to the converter unit, a redundant converter, a redundant amplifier connected to the redundant converter and a plurality of output connections, which are connected to the amplifier unit and the redundant amplifier. Each input connection is assigned a power divider, which divides an input power fed into each input connection and provides a first portion of the input power to the converter unit and provides a second portion of the input power to the redundancy switching mechanism, wherein the redundancy switching mechanism is embodied to feed a signal of one of the plurality of input connections to the redundant converter selectively.

The amplifier arrangement is described here as an example of a signal processing unit. The amplifier arrangement has a plurality of input connections. Signals are supplied to the amplifier arrangement via the input connections. Said signals are processed, that is to say amplified, by suitable electronic modules. The functions for processing the signals are implemented in the present case in a converter unit. The converter unit processes the signals or prepares them and then supplies the signals to the amplifier unit connected to the converter unit. The amplifier unit amplifies the signals and outputs them to the output connections, where the signals are fed for further processing or treatment.

The converter unit can contain a plurality of individual converters, wherein the individual converters are each connected to one or more input connections. The individual converters can be of identical structure, with the result that the converter unit ultimately consists of a plurality of identical converters that can be used in a modular manner.

The amplifier unit can likewise contain a plurality of individual amplifiers, wherein that described with reference to the converter unit and the converters applies analogously to the function and structure of the amplifier unit and the individual amplifiers.

A portion of the input connections, which are connected to a converter, the corresponding converter, the amplifier connected to said converter and the output connections connected to said amplifier can be referred to as a branch of the amplifier arrangement or as a function string. Such a function string receives signals, processes them, amplifies them and outputs them.

In addition to the converter unit and the amplifier unit, which are used for the nominal operation of the amplifier arrangement, a redundant converter and a redundant amplifier connected to the redundant converter are provided as part of the amplifier arrangement.

The redundant converter and the redundant amplifier can together take over the functionality of an above-described function string when a converter, an amplifier or another element in a function string fail, with the result that said function string can no longer fulfil its designated function.

In this case (when a function string or a part thereof fails), the redundancy switching mechanism conducts the signals from the input connections to the redundant converter, the signals are amplified by the redundant amplifier and provided to the output connections.

In order for the redundancy switching mechanism to be able to fulfil said option, the signals from each input connection are divided by means of a power divider. The first portion of the signals of an input connection is fed to a converter of the converter unit and the second portion is fed to the redundancy switching mechanism. As a result, a signal with a somewhat lower power is therefore present in the converter unit. However, this is not a problem because the amplifier unit connected downstream amplifies the signal anyway. The second portion of the signal of the input connection is available in the redundancy switching mechanism in order to be processed and output in the redundant function string when required.

The redundancy switching mechanism is configured in such a way that it receives on the input side in each case a portion of the input power of the signals from a plurality of input connections and, when required (that is to say in the event of redundancy, that is to say when a function string of the converter unit and the amplifier unit fails), provides one of said signals selectively to the redundant converter and the redundant amplifier.

In this way, an n to n−1 redundancy can be made possible. One redundant function string consisting of the redundant converter and the redundant amplifier can replace a function string composed of the converter unit and the amplifier unit.

The amplifier arrangement may be, for example, part of a system for frequency conversion by integrated mixers. For example, the amplifier arrangement can be used in signal processing paths of communication satellites. The input can have, for example, signals in the Ka band (20 GHz range) and an output in the Q band (40 GHz range). Other frequency ranges are of course also conceivable, in particular those in which waveguide transitions are used, for example the V band, Ku band, X band, C band, that is to say over the entire frequency range between 3 and 60 GHz.

According to one embodiment, the power divider is embodied to halve the input power fed into an input connection and to provide the first half to the converter unit and the second half to the redundancy switching mechanism.

The input power that is fed to the function string in the converter unit and the amplifier unit is therefore slightly reduced. However, this can be compensated for by a matched amplification factor. The second half of the input power is fed to the redundancy switching mechanism and is available to the redundant function string.

According to a further embodiment, the redundancy switching mechanism has a plurality of input isolators and a switching diode, wherein in each case an input isolator is connected to a power divider and provides the power supplied by the power divider to the switching diode.

The redundancy switching mechanism has an input isolator, in particular, for each input connection connected to the redundancy switching mechanism. The input isolators are connected to the switching diode so that a signal can be fed from a selected input connection to the switching diode. The switching diode is connected in turn to the redundant converter. The signal of one of the input connections can therefore be fed to the redundant converter selectively.

The redundancy switching mechanism can be controlled by a control unit, for example, wherein the control unit specifies which input isolator provides the input signal present to the switching diode and therefore to the redundant converter.

The input isolators ensure that a flow of power is possible only in the direction from the input connections to the redundant converter and not in the opposite direction.

According to a further embodiment, the amplifier unit is a semiconductor amplifier unit.

For example, the semiconductor amplifier unit may be a transistor amplifier, which is also referred to as an SSPA (solid-state power amplifier). The redundant amplifier can likewise be configured as a semiconductor amplifier. A semiconductor amplifier can therefore serve as redundancy for a semiconductor amplifier unit by means of the redundancy switching mechanism configured as described herein.

According to a further embodiment, the amplifier arrangement furthermore has an output switching mechanism with a plurality of output switches, wherein the output switching mechanism is connected to the output connections and is embodied to feed an output connection to an output of the amplifier arrangement selectively.

The output switching mechanism can be considered as a counterpart to the redundancy switching mechanism arranged on the input side. If a function string fails, the redundancy switching mechanism on the input side conducts the input connections of the failed function string to the redundant converter and the redundant amplifier selectively. On the output side, the output connections are fed by the output switching mechanism to an output of the amplifier arrangement selectively, which occurs, in particular, when the redundant function string replaces a nominal function string.

That is to say when a nominal function string fails, nothing changes in the signals that are provided to the input connections. Similarly, nothing changes in the signals that are output at the output of the amplifier arrangement. The redundancy is thus implemented completely internally in the amplifier arrangement and has no influence on either the input side or the output side of the amplifier arrangement, that is to say is completely transparent for systems that are connected to the amplifier arrangement.

According to a further embodiment, the output switches are waveguide switches, which have more than one switch position.

Waveguide switches have the advantage that they can switch high powers in a very large frequency range. They are therefore well suited for the envisaged application in a signal processing path of a communication satellite.

The switch position of such a waveguide switch determines which output connection of the amplifier unit or the redundant amplifier is fed to an output of the amplifier arrangement.

According to a further embodiment, the output switches are configured to switch an individual output connection from at least two output connections to an output selectively.

Just as on the input side an input connection is fed to the redundancy switching mechanism and is provided by the redundancy switching mechanism to the redundant converter and redundant amplifier, on the output side a selective connection is established between the output connections and the outputs of the amplifier arrangement in order to feed the output connections of the amplifier unit or the redundant amplifier to the outputs of the amplifier arrangement.

According to a further embodiment, the output switches are configured to be switched directly into one of a plurality of possible switch positions.

The output switch is preferably a switch in which any switch position can be prescribed directly, for example by a control unit.

According to a further embodiment, the amplifier arrangement furthermore has a control arrangement (can also be referred to as control unit) with a plurality of control modules, wherein each control module is embodied to actuate each output switch so that each individual output switch is actuated by a plurality of control modules with the same command for a switch position desired for said output switch.

The control arrangement is thus constructed according to the same redundancy concept as the function strings of the amplifier arrangement. If a control module fails, the other control modules take over the function of the failed control module. Whether an output switch receives the command for a specific switch position from one control module or from a plurality of control modules therefore has no effect on the actual switch position; when a control module fails, the output switch receives the command from a different control module; if the output switch has already received the command from one control module, nothing changes in its switch position when it receives the same command for the same switch position a further time.

According to a further embodiment, at least some component parts of the amplifier arrangement are arranged in a respective inner housing, wherein the inner housing is surrounded by an outer housing and is spaced apart from the outer housing by a circumferential air gap in at least one plane.

The inner housing and the outer housing are preferably arranged as is described further below with reference to a high-frequency system.

Component parts of a function string as described above are preferably contained in the inner housing. For example, the power divider, a converter, an amplifier of a function string are arranged in the inner housing. However, further component parts can also be arranged in the inner housing, such as, for example, an input filter, which is connected upstream of the power divider, an output filter, which is connected downstream of the amplifier, and/or an output circulator. The inner housing and the component parts contained therein form a function string, which can be used as a module and placed in the outer housing.

The component parts in the inner housing can be arranged on one or more printed circuit boards and can be connected to one another in a suitable manner, for example. In order to transmit the signals to the component parts in the inner housing (on the input side) or to transmit them from said component parts to the output (on the output side), the input connections and the output connections can first be electrically connected to the inner housing. The inner housing consists of an electrically conductive material, for example aluminium or an aluminium alloy. The inner housing can be silver-plated or gold-plated, for example.

The input connections can be fed to an inner wall or a lug or a projection of the inner housing, for example by means of a microstrip connection or a microstrip line and via a wire bond connection, in order to produce an electrical connection to the inner housing. The microstrip connection is a conductor track, which is arranged on the printed circuit board on which the electrical components are located. In this case, the microstrip connection is electrically connected to some of the electrical components in order to supply an electrical signal to the electrical components or to receive an electrical signal from them.

What is known as a wire bond is an electrical waveguide consisting of one or more electrically conductive tracks. The tracks may be applied to a dielectric.

The microstrip connection is electrically connected to a mating point (for example a bonding lug) located on the inner housing by means of wire bonds. The bonding lug couples to the waveguide, which is fed from the inner housing via the air gap into the outer housing.

Flat cables or flat lines can also be used for the bonding, which is known as ribbon bonding.

A wireless high-frequency connection via the circumferential air gap exists between the inner housing and the outer housing. The electrical signals that are electrically transmitted from the function string to the inner housing are transmitted as high-frequency signals via the air gap to the outer housing and one (or more) waveguide connection(s) located on the outer housing. Therefore, a wired connection is not necessary for the transmission of the electrical signals between the inner housing and the waveguide connection of the outer housing. Such a wired connection at this location could entail disadvantages, such as a low quality of the connection, for example. Such a wired connection at this location could likewise complicate the assembly of the inner housing and the outer housing.

According to a further aspect, a high-frequency system is specified. The high-frequency system has an inner housing and an outer housing. The outer housing surrounds the inner housing so that a circumferential air gap runs in at least one plane between the inner housing and the outer housing and the inner housing is spaced apart from the outer housing in the plane in which the air gap runs. At least one electrical module, which is configured to process high-frequency signals, is arranged in a cavity of the inner housing. A high-frequency connection is arranged on the outer housing, wherein a signal to be transmitted via the high-frequency connection is transmitted via the air gap between the inner housing and the outer housing.

The outer housing can be configured, for example, as a frame that surrounds the inner housing. In other words, circumferential side faces of the inner housing are surrounded by the outer housing and spaced apart therefrom. The air gap is arranged between the side faces of the inner housing and the outer housing. The air gap can be several tens of millimetres wide (spacing between the inner housing and the outer housing), for example between 0.1 and 0.3 millimetres, in particular between 0.1 and 0.2 millimetres. In one embodiment, the air gap is 0.15 millimetres wide.

In one embodiment, the inner housing has an end face with a toothed structure, wherein the toothed structure of the end face is located opposite the high-frequency connection on the outer housing.

The toothed structure is arranged, in particular, in a circumferential manner around the opening of the cavity in the inner housing. The cavity in the inner housing constitutes a waveguide in functional terms. The opening of the cavity is accordingly a waveguide opening. The teeth of the toothed structure are arranged circumferentially around said waveguide opening.

In one embodiment, the high-frequency system furthermore has a carrier unit, on which the outer housing and the inner housing are arranged, wherein the outer housing and the inner housing are separated from one another by the air gap in the plane of the carrier unit.

The carrier unit can be, for example, a printed circuit board on which the inner housing and the outer housing are arranged. The printed circuit board supplies the inner housing with electrical energy in order to operate the electrical components in the inner housing. The printed circuit board also serves to mechanically hold the inner housing and the outer housing and to fix them relative to one another.

In one embodiment, the inner housing is coupled to the carrier unit in a reversible manner.

The inner housing can therefore be plugged onto the carrier unit as a module. In this case, the inner housing is plugged in such a way that it is surrounded by the outer housing. The inner housing does not touch the outer housing and is instead held at a distance from the outer housing by the carrier unit. The inner housing can therefore be exchanged without mechanical connections between the inner housing and the outer housing having to be released or produced. Attached to the outer housing are waveguides, which function as signal feed lines or signal output lines for high-frequency signals (HF signals, for example signals with frequencies between 3 GHz and 40 GHz, in particular signals for the transmission of which waveguides are suitable and typically used). The HF signals undergo signal processing in the inner housing. In any case, given a change in the signal processing, the inner housing can be exchanged easily by virtue of the existing inner housing being replaced by a modified inner housing. Said change can be carried out with little effort.

The inner housing is connected to the carrier unit, for example by means of a plug or clamping connection, in such a way that electrical energy, in particular direct current, can be transmitted to the inner housing and the electrical components thereof.

In one embodiment, the electrical module in the inner housing is electrically connected to the inner housing by means of a wire bond.

A HF signal is provided to the inner housing via the wire bond and then propagates as a wave via the inner housing and the air gap to the outer housing, or vice versa.

According to a further aspect, an inner housing for a high-frequency system as described herein is specified, wherein the inner housing has a cavity, in which an electrical component is arranged, wherein the electrical component is electrically coupled to the inner housing, wherein the inner housing is configured to transmit high-frequency signals via an air gap to an outer housing, which surrounds the inner housing, wherein the inner housing is configured to be inserted into a high-frequency system in a modular manner.

BRIEF DESCRIPTION OF THE DRAWINGS

Exemplary embodiments are described in more detail below with reference to the appended drawings. The illustrations are schematic and not to scale. Identical reference signs refer to identical or similar elements. In the drawings.

DETAILED DESCRIPTION

Figure 1:
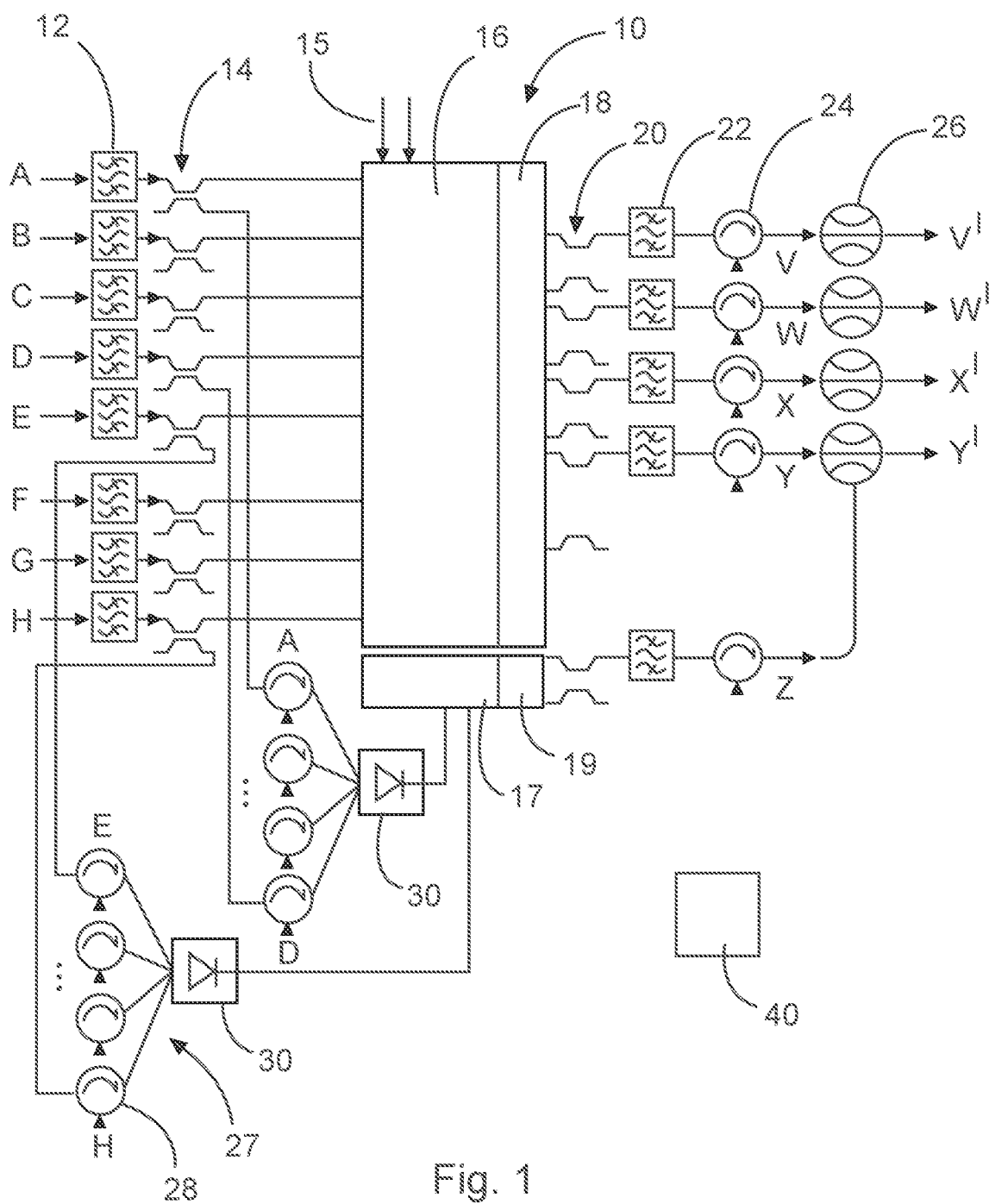
FIG. 1 shows a schematic illustration of an amplifier arrangement.

FIG. 1 shows a schematic illustration of an amplifier arrangement 10. The amplifier arrangement 10 is fed with input signals via input connections A to H. An input connection is connected to an input filter 12 and the output of the input filter 12 is connected to a power divider 14. The power divider 14 divides the input power of a signal supplied to an input connection and supplies a portion of the input power to the converter unit 16 and the other portion of the input power to the redundancy switching mechanism 27.

The signals of all input connections A to H are fed to a converter unit 16. The converter unit 16 is a combination of a plurality of individual converters. Said converters can be separated from one another structurally or can be housed in one component. For the sake of clarity, FIG. 1 shows only one functional module for the converter unit 16. The converter unit 16 has an input 15 for connecting a local oscillator. The converter unit 16 is connected to the amplifier unit 18. In this case, the amplifier unit 18 can likewise consist of a plurality of individual amplifiers (the description of the converter unit applies analogously), even though FIG. 1 shows only a single module for the amplifier unit 18.

An amplifier of the amplifier unit 18 can have a plurality of electronic components, for example semiconductor elements, the outputs of which are combined subsequent to the amplifier unit. This function is performed by the power coupler 20. The power couplers 20 pass the signal to an output filter 22, from which the signal is fed to an output circulator 24. The output circulator 24 outputs a signal via the output connection V to Z to an output switching mechanism consisting of a plurality of output switches 26. The output switching mechanism connects an output connection V to Z selectively to an output V' to Y'.

The amplifier arrangement 10 consists in functional terms of a plurality of function strings, wherein a function string is arranged between input connection A to H and output connection V to Z and in this example consists of the following component parts: input filter 12, power divider 14, converter, amplifier, power coupler 20, output filter 22, output circulator 24.

In addition to the component parts described so far, the amplifier arrangement 10 has two redundancy switching mechanisms 27, a redundant converter 17 and a redundant amplifier 19. A portion of the power of the signal is fed from each input connection A to H via the power divider 14 to an input of one of the redundancy switching mechanisms 27. In the present example, the four input connections A to D are each fed to an input isolator 28 of a redundancy switching mechanism and the four input connections E to H are fed to the input isolators 28 of the second redundancy switching mechanism. The input isolators 28 pass the signal to a switching diode 30, which in turn is connected to the redundant converter 17, from which the signal is fed to the redundant amplifier 19 and to the output connection Z.

The output connections V to Z can be fed selectively to one of the outputs V' to Y', and specifically depending on the position of the output switches 26.

A control arrangement 40 including energy supply is likewise part of the amplifier arrangement 10 and is connected to the redundancy switching mechanism 27 and the output switching mechanism consisting of the output switches 26 in order to feed the input connections of a function string via the redundant converter 17 and the redundant amplifier 19 to the output connection Z when required.

If, for example, the function string that supplies the signal for the output connection Y during nominal operation fails, first the redundancy switching mechanism 27 is switched so that the corresponding input connections, that is to say two selected input connections from the totality of the input connections A to H, are fed to the redundant converter 17 and the redundant amplifier 19 so that a signal is output to the output connection Z. For this purpose, two input isolators 28 of the redundancy switching mechanism 27 are brought into a state in which they provide the signal, fed to them by the power divider 14, to the switching diode 30, whereas the other input isolators 28 do not provide a signal to the switching diode 30. The output switch 26, which in nominal operation feeds the output connection Y to the output Y', is brought into a switch position in order to feed the output connection Z to the output Y'. The function strings that supply the signals to the output connections V to X are not influenced by this.

Figure 2:
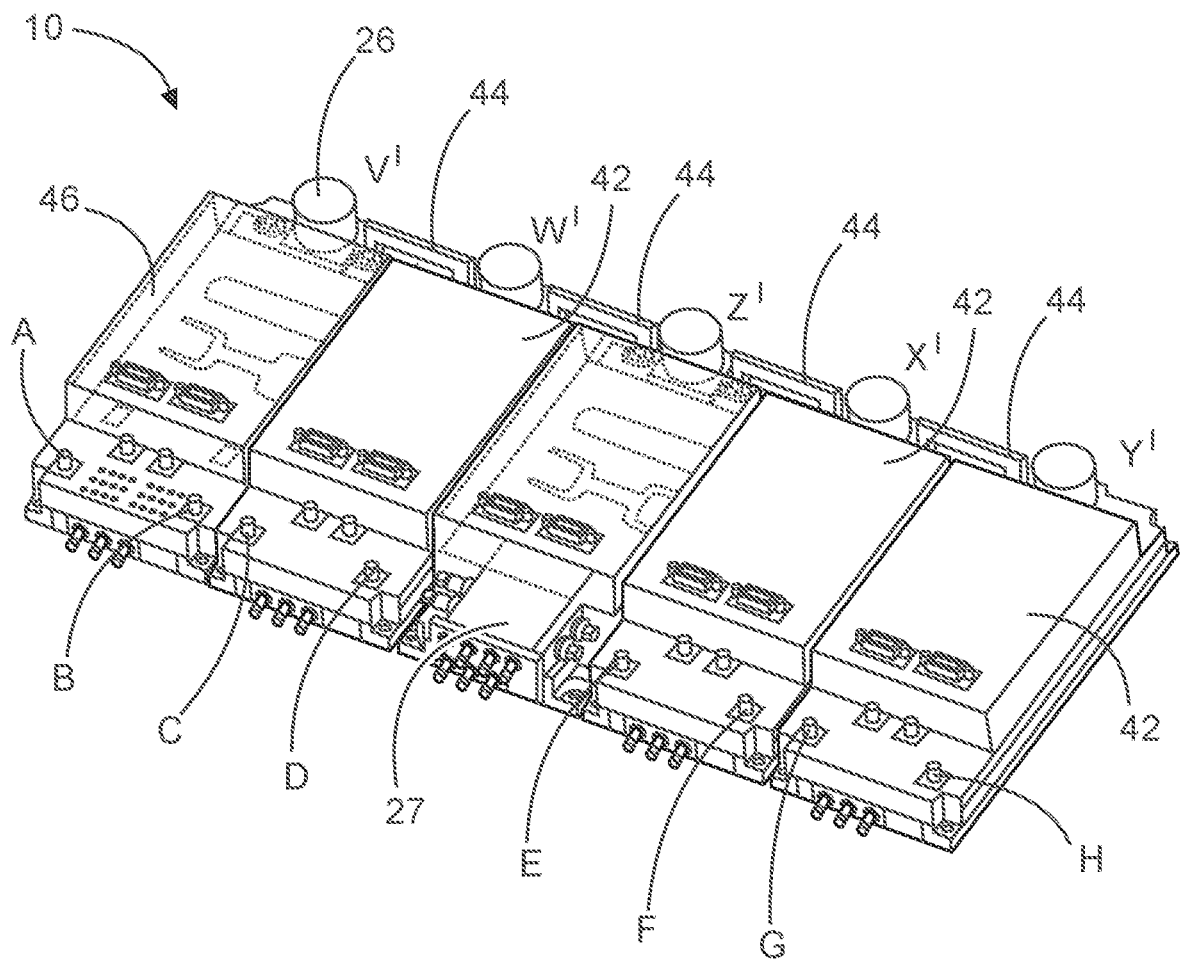
FIG. 2 shows a further schematic illustration of an amplifier arrangement.

FIG. 2 shows the modular structure of the amplifier arrangement 10. The amplifier arrangement 10 is modularized so that a function string is depicted as a module. For example, a module receives the input connections A and B and processes them according to the description with respect to FIG. 1. The module is arranged in a housing 46 and outputs the output V' via the assigned output switch 26. From each module, a portion of the input power of the input connections is fed to the redundancy switching mechanism 27, wherein the lines for this are not illustrated.

The modules for the input connections C and D, E and F, G and H have an analogous structure to the module for the input connections A and B. A further module with the redundancy switching mechanism 27, the output connections of which lead into the output Z', is located centrally between said modules.

Each function string has a control module 42 with an energy supply. The output switches 26 are connected to one another by means of waveguide connectors 44.

The amplifier arrangement 10, as has been described with reference to FIG. 1 and FIG. 2, provides internal redundancy and describes the modules and techniques necessary for this. A redundancy switching mechanism with diode switches is arranged on the input side and integrated waveguide switches are used on the output side. In nominal operation, the redundancy switching mechanism is not required, with the result that the diode switches do not demonstrate any considerable energy consumption. The output switches 26 are supplied with energy by the control module 42 of each function string. That is to say that if a function string fails and is replaced by the redundant function string, the output switch 26 is also supplied with energy by the control module 42 of the redundant function string. The output switches 26 can directly assume a commanded or arbitrary switching state. In the present case, all output switches 26 receive in succession an instruction for the desired switching state from all control modules 42. If the corresponding output switch is already in the correct switching state due to an instruction of another control module, nothing changes in said switching state by the further instruction. However, if a control module has failed, the next control module transfers the output switch 26 to the desired switching state.

Figure 3:
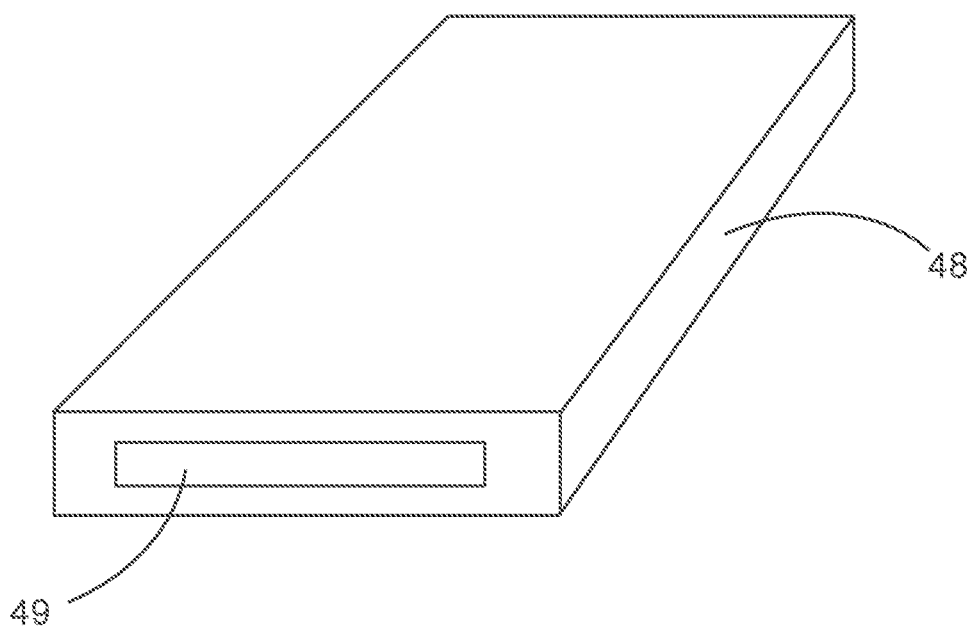
FIG. 3 shows a schematic illustration of an inner housing.

FIG. 3 shows the inner housing 48, which is a constituent part of the housing 46 of a module of the amplifier arrangement 10. The inner housing 48 has a cavity 49, in which the electronic components and component parts of a module of the amplifier arrangement 10 are located. The component parts in the inner housing 48 can be accessible, for example, from two opposite side faces of the inner housing. The electronic components in the inner housing are electrically connected to the inner housing using a microstrip line. Signals to the or from the electronic components are transmitted via said connection.

Figure 4:
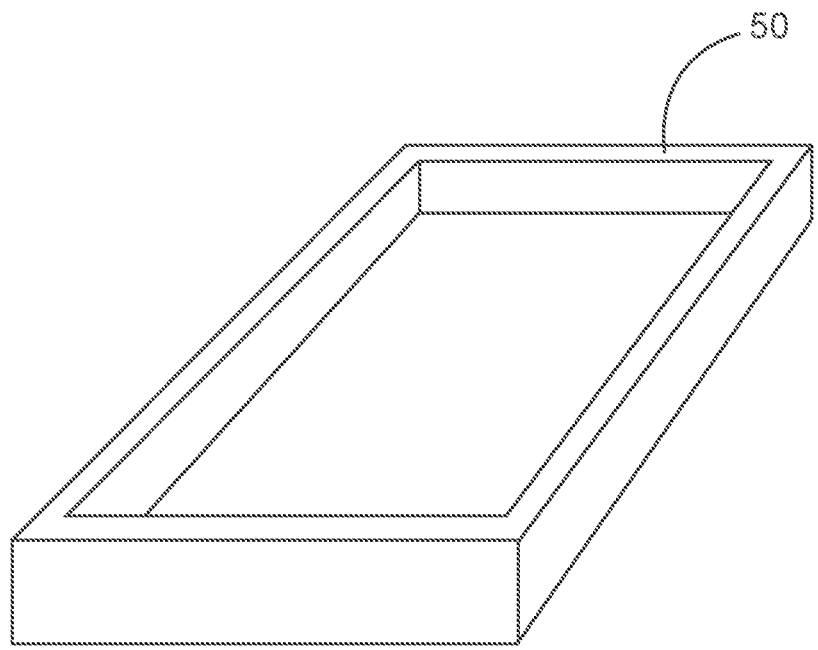
FIG. 4 shows a schematic illustration of an outer housing.

FIG. 4 shows the outer housing 50, which can also be referred to as frame, and is a constituent part of the housing 46 just like the inner housing 48. The inner housing 48 is inserted into a recess of the outer housing 50 in order to assemble the housing 46. The outer housing 50 surrounds the inner housing 48. However, in order to be able to insert the inner housing 48 into the outer housing 50, the inner housing must be somewhat smaller than the recess in the outer housing. The inner housing is preferably inserted into the outer housing in such a way that the inner housing is surrounded by an air gap laterally, that is to say in the circumferential direction of the frame-like outer housing 50 shown in FIG. 4. In other words, an inner wall of the frame of the outer housing 50 is spaced apart from an outer face of the inner housing. This structure simplifies the assembly of the housing 46.

Figure 5:
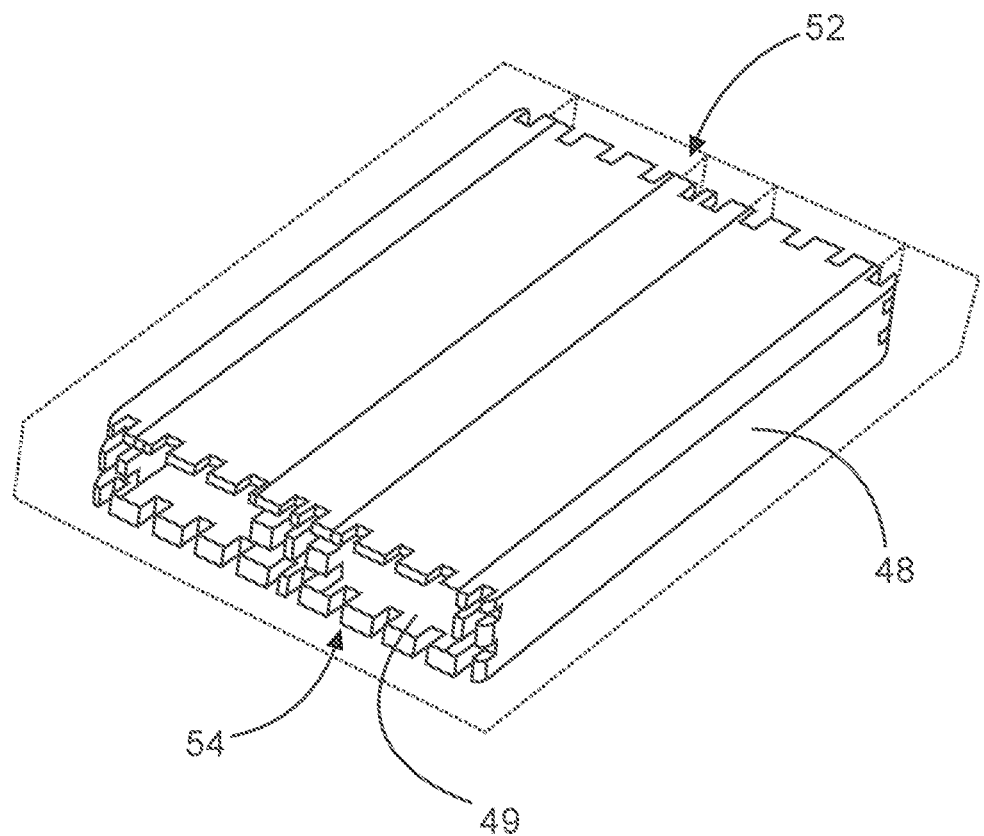
FIG. 5 shows a schematic illustration of an inner housing.

FIG. 5 shows a detailed structure of the end faces of the inner housing 48. The cavity 49 is accessible from the front end face 54 and the opposite end face 52. The edges of the inner housing 48, which surround the cavity 49, have a toothed structure with alternating elevations and depressions. This structure of the inner housing is advantageous for transmitting high-frequency signals wirelessly from the inner housing to a waveguide connection in the outer housing. The depressions and/or elevations on the end faces of the inner housing 48 can have the same dimensions and spacings, that is to say that all elevations have the same width and all depressions have the same width, while the width of the elevations may be different from the width of the depressions.

Figure 6:
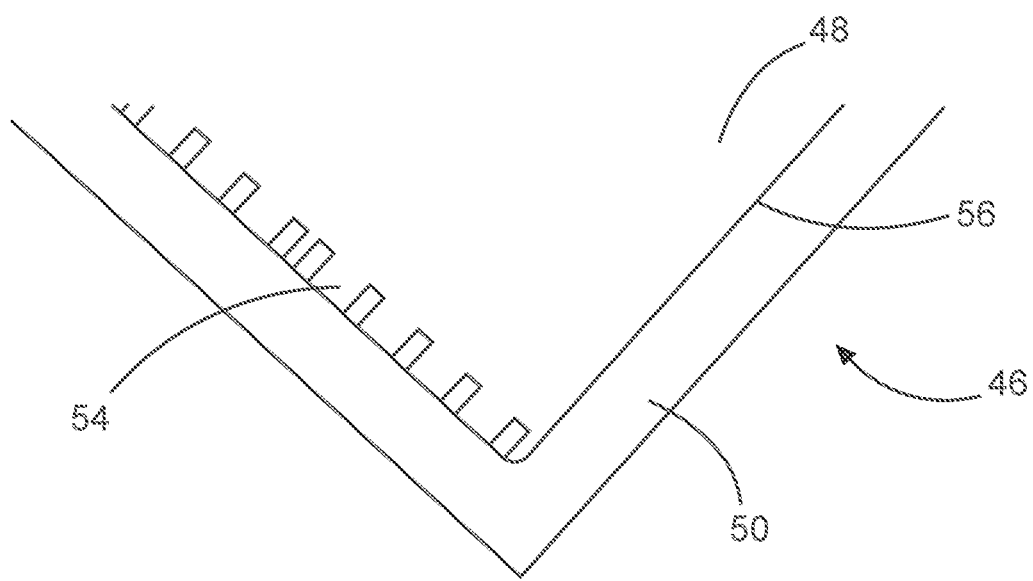
FIG. 6 shows a schematic illustration of a housing of an amplifier arrangement or of a high-frequency system.

FIG. 6 shows a detailed view of the housing 46, wherein the inner housing 48 is inserted in the outer housing 50. An air gap 56 is located between the inner housing 48 and the outer housing 50. The tooth structure on the end face of the inner housing 48 described with respect to FIG. 5 can also be seen.

Figure 7:
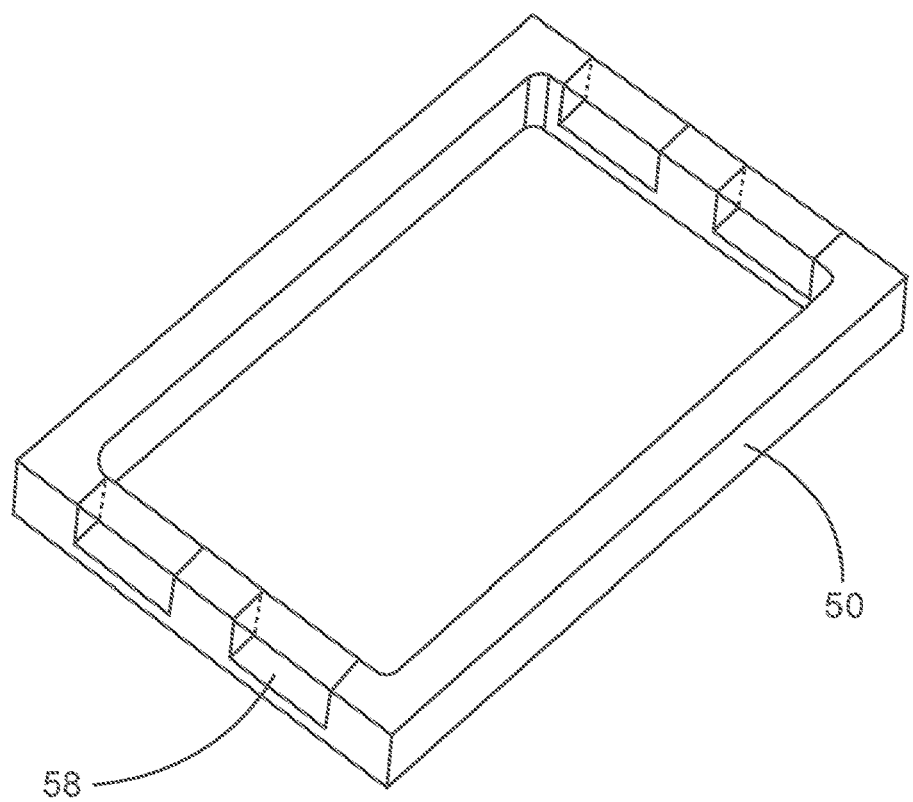
FIG. 7 shows a schematic illustration of an outer housing.

FIG. 7 shows a detailed view of the outer housing 50 with four waveguide connections 58, which are arranged on the end faces of the outer housing 50 and adjacent to the end faces of the inner housing 48 with the openings to the cavity 49. The cavity 49 in the inner housing 48 can also be considered as an extension of the waveguide connection 58 in the outer housing. The cross-section of the cavity 49 in the inner housing 48 can be identical to the cross-section of the waveguide connection 58.

In this configuration, the inner housing 48 is inserted into the recess in the outer housing 50 from above. The high-frequency connection between the electronic components in the inner housing and the outer housing is produced by means of the air gap in relation to the waveguide connection 58. The high-frequency signal is fed starting from the waveguide connection 58 to the output switches by means of a waveguide, cf. FIG. 2.

The electronic components in the inner housing can be supplied with energy via terminals on the underside of the inner housing. This is shown schematically in FIG. 8.

Figure 8:
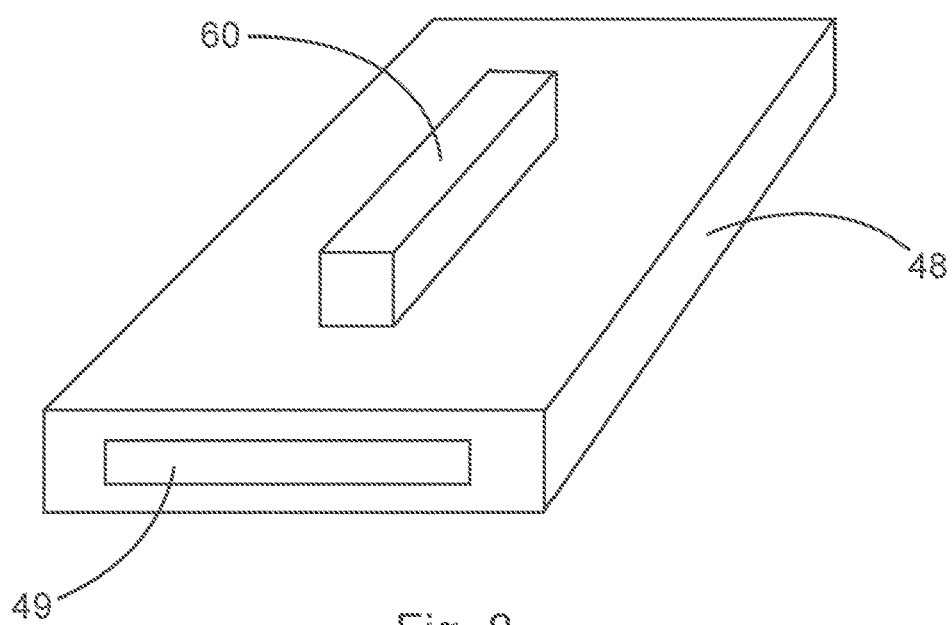
FIG. 8 shows a schematic illustration of an inner housing with an energy supply interface.

FIG. 8 shows an inner housing 48 with a cavity 49. An energy supply interface 60 is mounted on one surface. In this case, it is a plug or clamping connector, for example. The inner housing 48 can be plugged onto a carrier unit using said energy supply interface 60. Here, the energy supply interface 60 faces in the direction of the carrier unit.

For example, the inner housing 48 can be plugged onto a carrier unit as part of the housing 46 from FIG. 2.

Figure 9:
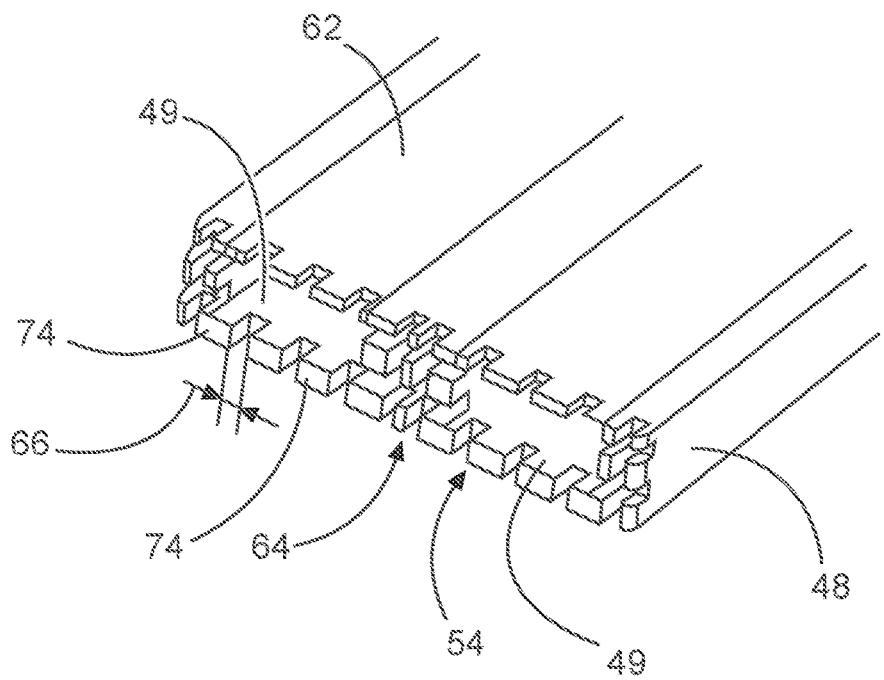
FIG. 9 shows a schematic illustration of an inner housing of a high-frequency system.

FIG. 9 shows a detailed view of the end face 54 of the inner housing 48, as has already been shown in FIG. 5. The end face 54 of the inner housing 48 shows two cavities 49, which each form a HF path. Each cavity 49 is surrounded circumferentially on the end face 54 by a toothed structure.

The inner housing can be configured as half-shell. As can be seen in FIG. 9, the material thickness on the upper side in the region of the cover 62 is lower than on the base side. The cover 62 can be removed in order to thus expose the cavity 49, for example in order to assemble the electrical components in the cavity.

The teeth 74 surround the openings of the cavity 49 on the end face 54 of the inner housing 48. The width of the teeth, that is to say the extent in the circumferential direction of the openings of the cavity 49, is identical for all teeth, for example. The width 66 of the depression between the teeth 74 can also be identical around an opening of a cavity 49, but does not necessarily have to correspond to the width of the teeth.

A vertical HF isolation 64 is arranged between the two waveguide paths. This is likewise illustrated as a toothed structure. The HF isolation 64 ensures isolation of the two waveguide paths from one another so that the HF signals of a waveguide path do not significantly interfere with the HF signals of the other waveguide path.

The HF isolation 64 ensures signal attenuation between the waveguide paths of 80 dB or more. The matching at the waveguide opening, that is to say at the HF transition from inner housing to outer housing, is in one example 25 to 30 dB or better.

The structure on the opposite end face of the inner housing is usually of identical configuration, wherein the toothed structure can also be different in terms of detail (width of the teeth or of the depressions between the teeth, etc.). Even though the previous figures illustrate the inner housing in such a way that the openings of the cavity are arranged on opposite sides, said openings can also be arranged at a 90° angle to one another. The waveguide input and the waveguide output can be arranged on the inner housing as desired. The wire bonds of the electrical components in the cavity must then be connected to the inner housing accordingly.

Figure 10:
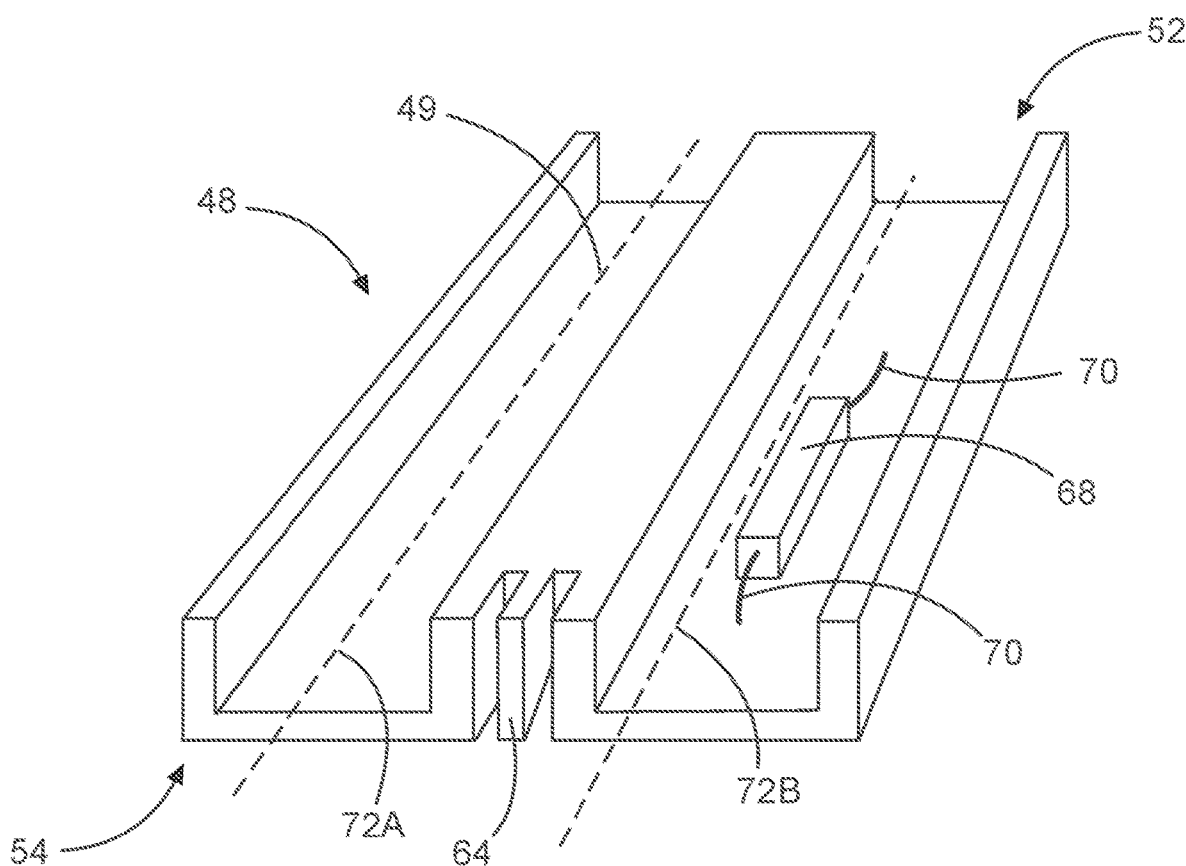
FIG. 10 shows a schematic illustration of an inner housing.

FIG. 10 shows an illustration of the inner housing 48 without a cover 62 (see FIG. 9). It is apparent that the inner housing 48 is produced as a half-shell. For reasons of clarity, the input opening on the end face 54 in the cavity has been shown in FIG. 10 without a toothed structure. However, it should be understood that the tooth structure may nevertheless be present.

The two waveguide paths 72A, 72B can be seen and are shown using dashed lines. The HF isolation 64 is likewise shown as a vertically running structure between the two waveguide paths 72A, 72B.

By way of example, FIG. 10 shows in a cavity an electrical component 68 in the form of a printed circuit board with one or more components. The electrical component 68 is electrically connected to a surface of the cavity in the inner housing by means of wire bonds 70. HF signals are transmitted to the electrical component or output by same via the wire bonds. The signal path runs, for example, via the air gap to the end face 54, to the cavity 49, via the wire bond 70 to the electrical component 68, then the signal is output via the other wire bond 70 in the direction of the opening on the end face 52.

Figure 11:
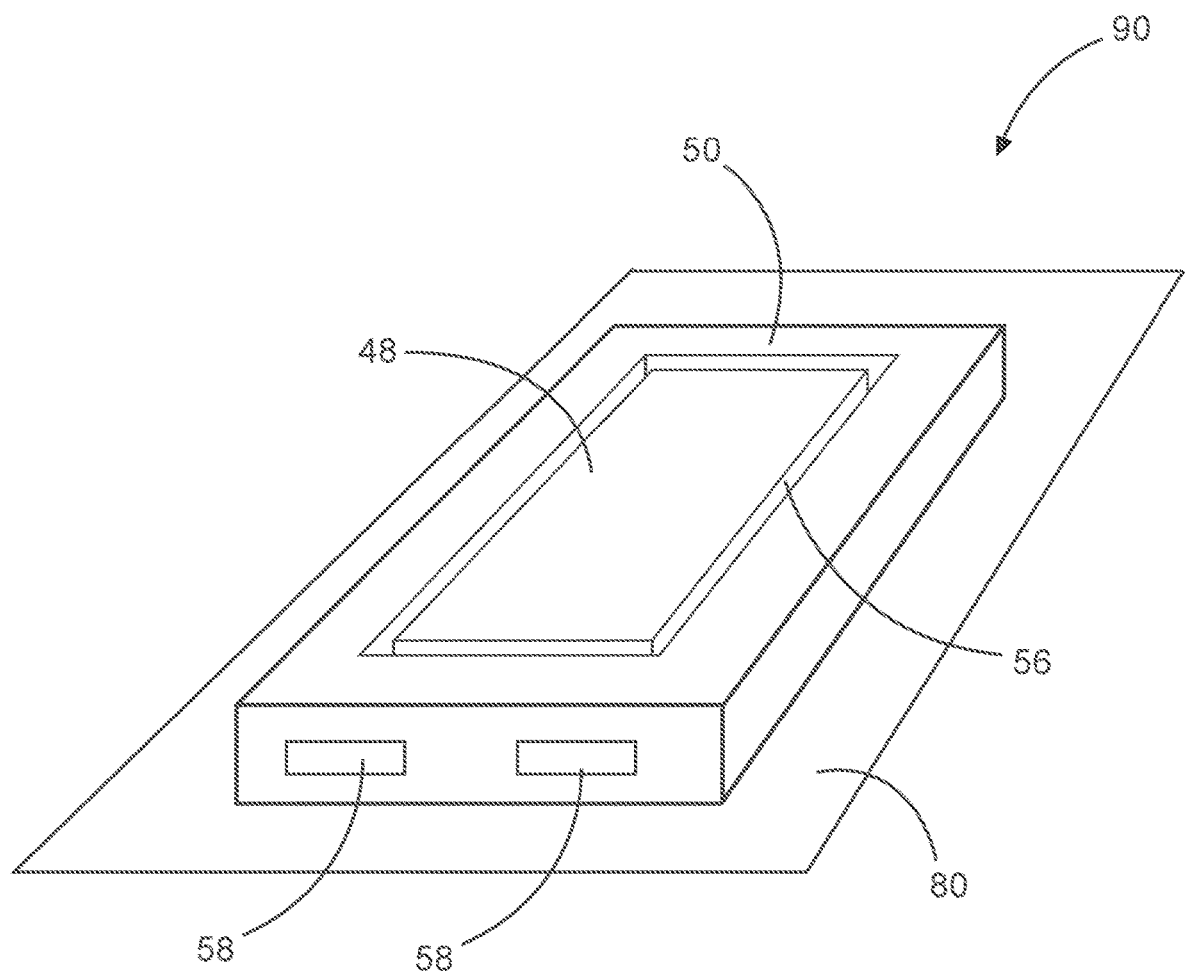
FIG. 11 shows a schematic illustration of a high-frequency system.

FIG. 11 shows an overview illustration of a high-frequency system 90 consisting of a carrier unit 80, for example a printed circuit board, on which the outer housing 50 and the inner housing 48 are arranged. An air gap 56 runs between the inner housing 48 and the outer housing 50 in the plane of the carrier unit 80. High-frequency connections or waveguide connections 58, which, for example, are aligned flush with the cavities of the inner housing 48 (see FIGS. 9 and 10), are arranged on the outer housing 50. Waveguides are connected to the waveguide connections 58 from outside, then HF signals can be transmitted from the waveguides to the waveguide connections 58 and via the air gap 56 to the inner housing 48 or vice versa.

It is additionally pointed out that "comprising" or "having" does not rule out other elements or steps, and "a" or "an" do not rule out a multiplicity. It is also pointed out that features or steps that have been described with reference to one of the above exemplary embodiments may also be used in combination with other features or steps of other exemplary embodiments described above. Reference signs in the claims are not to be regarded as limiting.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

10 Amplifier arrangement
12 Input filter
14 Power divider
15 Local oscillator input
16 Converter unit
17 Converter
18 Amplifier unit
19 Amplifier
20 Power coupler
22 Output filter
24 Output circulators
26 Output switch
27 Redundancy switching mechanism
28 Input isolator
30 Switching diode
40 Control arrangement and energy supply
42 Control module and energy supply
44 Waveguide connector
46 Housing
48 Inner housing
49 Cavity
50 Outer housing, frame
52 End face
54 End face
56 Air gap
58 High-frequency connection, waveguide connection
60 Energy supply interface
62 Cover
64 HF isolation
66 Width
68 Printed circuit board with electrical components
70 Wire bond
72A HF path
72B HF path
74 Tooth
80 Carrier unit, printed circuit board
90 High-frequency system
A-H Input connections
V-Z Output connections
V'-Z' Outputs

The invention claimed is:

1. An amplifier arrangement comprising:
a plurality of input connections;
a redundancy switching mechanism;
a converter unit;
an amplifier unit connected to the converter unit;
a redundant converter;
a redundant amplifier connected to the redundant converter;
a plurality of output connections connected to the amplifier unit and the redundant amplifier; and
wherein each input connection is assigned a power divider, which divides an input power fed into each input connection and provides a first portion of the input power to the converter unit and provides a second portion of the input power to the redundancy switching mechanism; and wherein the redundancy switching mechanism is embodied to feed a signal of one of the plurality of input connections to the redundant converter selectively.

2. The amplifier arrangement according to claim 1, wherein the power divider is configured to halve the input power fed into an input connection and to provide the first half to the converter unit and the second half to the redundancy switching mechanism.

3. The amplifier arrangement according to claim 1, wherein the redundancy switching mechanism has a plurality of input isolators and a switching diode, wherein a respective input isolator is connected to a power divider and is configured to provide the power supplied by the power divider to the switching diode.

4. The amplifier arrangement according to claim 1, wherein the amplifier unit is a semiconductor amplifier unit.

5. The amplifier arrangement according to claim 1, further comprising an output switching mechanism with a plurality of output switches;

wherein the output switching mechanism is connected to the output connections and is configured to feed an output connection selectively to an output of the amplifier arrangement.

6. The amplifier arrangement according to claim 5, wherein the output switches are waveguide switches, which have more than one switch position.

7. The amplifier arrangement according to claim 5, wherein the output switches are configured to switch an individual output connection from at least two output connections to an output selectively.

8. The amplifier arrangement according to claim 5, wherein the output switches are configured to be switched directly into one of a plurality of possible switch positions.

9. The amplifier arrangement according to claim 5, further comprising a control arrangement with a plurality of control modules;

wherein each control module is configured to actuate each output switch so that each individual output switch is actuated by a plurality of control modules with the same command for a switch position desired for said output switch.

* * * * *